(12) United States Patent
Mullick et al.

(10) Patent No.: US 11,515,207 B2
(45) Date of Patent: Nov. 29, 2022

(54) METHODS OF FORMING METAL CHALCOGENIDE PILLARS

(71) Applicant: Applied Materials, Inc., Santa Clara, CA (US)

(72) Inventors: Amrita B. Mullick, Santa Clara, CA (US); Srinivas Gandikota, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/512,660

(22) Filed: Oct. 27, 2021

(65) Prior Publication Data

US 2022/0051941 A1 Feb. 17, 2022

Related U.S. Application Data

(63) Continuation of application No. 16/294,109, filed on Mar. 6, 2019, now Pat. No. 11,189,529.
(Continued)

(51) Int. Cl.
*H01L 21/3213* (2006.01)
*C23C 16/30* (2006.01)
(Continued)

(52) U.S. Cl.
CPC ...... *H01L 21/76897* (2013.01); *C23C 14/046* (2013.01); *C23C 14/0623* (2013.01);
(Continued)

(58) Field of Classification Search
CPC ......... H01L 21/02205; H01L 21/02568; H01L 21/321; H01L 21/32133; H01L 21/76802;
(Continued)

(56) References Cited

U.S. PATENT DOCUMENTS 5,699,291 A 12/1997 Tsunemine
8,021,486 B1 9/2011 Yu et al.
(Continued)

FOREIGN PATENT DOCUMENTS

KR 20070017509 A 2/2007

OTHER PUBLICATIONS

PCT International Search Report and Written Opinion in PCT/US2019/020910 dated Jun. 13, 2019, 9 pages.
(Continued)

*Primary Examiner* — Herve-Louis Y Assouman
*Assistant Examiner* — Christopher M Roland
(74) *Attorney, Agent, or Firm* — Servilla Whitney LLC

(57) ABSTRACT

Methods of producing a self-aligned structure comprising a metal chalcogenide are described. Some methods comprise forming a metal-containing film in a substrate feature and exposing the metal-containing film to a chalogen precursor to form a self-aligned structure comprising a metal chalcogenide. Some methods comprise forming a metal-containing film in a substrate feature, expanding the metal-containing film to form a pillar and exposing the pillar to a chalogen precursor to form a self-aligned structure comprising a metal chalcogenide. Some methods comprise directly forming a metal chalcogenide pillar in a substrate feature to form a self-aligned structure comprising a metal chalcogenide. Methods of forming self-aligned vias are also described.

20 Claims, 5 Drawing Sheets

Related U.S. Application Data

(60) Provisional application No. 62/639,207, filed on Mar. 6, 2018.

(51) Int. Cl.
    *C23C 14/14*     (2006.01)
    *C23C 14/04*     (2006.01)
    *C23C 16/04*     (2006.01)
    *C23C 14/58*     (2006.01)
    *H01L 21/768*    (2006.01)
    *C23C 14/06*     (2006.01)
    *H01L 21/02*     (2006.01)
    *H01L 21/321*    (2006.01)

(52) U.S. Cl.
    CPC .......... *C23C 14/14* (2013.01); *C23C 14/5866* (2013.01); *C23C 16/045* (2013.01); *C23C 16/305* (2013.01); *H01L 21/02568* (2013.01); *H01L 21/321* (2013.01); *H01L 21/76802* (2013.01); *H01L 21/76877* (2013.01); *H01L 21/32133* (2013.01); *H01L 2924/0111* (2013.01); *H01L 2924/01042* (2013.01); *H01L 2924/01074* (2013.01)

(58) Field of Classification Search
    CPC ......... H01L 21/76805; H01L 21/76816; H01L 21/76877; H01L 21/76885; H01L 21/76897; H01L 2924/01042; H01L 2924/01074; H01L 2924/0111; C23C 14/046; C23C 14/0623; C23C 14/14; C23C 14/5866; C23C 16/045; C23C 16/305
    See application file for complete search history.

(56) References Cited

U.S. PATENT DOCUMENTS

| | | |
|---|---|---|
| 11,189,529 B2* | 11/2021 | Mullick ............... H01L 21/321 |
| 2005/0167846 A1 | 8/2005 | Aoyama |
| 2005/0197265 A1 | 9/2005 | Rath et al. |
| 2008/0124833 A1 | 5/2008 | Ruiz et al. |
| 2013/0109148 A1 | 5/2013 | Oh et al. |
| 2013/0260527 A1 | 10/2013 | Carter |
| 2016/0372365 A1 | 12/2016 | Tang et al. |
| 2017/0073812 A1 | 3/2017 | Sundaram |
| 2017/0358483 A1 | 12/2017 | Roy et al. |
| 2018/0127873 A1 | 5/2018 | Sarnet et al. |

OTHER PUBLICATIONS

Luxa, Jan, et al., "Graphene-Amorphous Transition Metal Chalcogenide (MoSx, WSx) as a Highly Efficient Hybrid Electrocatalyst for Hydrogen Evolution Reaction", ChemElectroChem, vol. 3, Issue 4, pp. 565-571, Dec. 23, 2015.

* cited by examiner

METHODS OF FORMING METAL CHALCOGENIDE PILLARS

CROSS-REFERENCE TO RELATED APPLICATIONS

This application is a continuation of U.S. application Ser. No. 16/294,109, filed Mar. 6, 2019, which claims priority to U.S. Provisional Application No. 62/639,207, filed Mar. 6, 2018, the entire disclosures of which are hereby incorporated by reference herein.

FIELD

Embodiments of the disclosure generally relate to methods for forming metal chalcogenide pillars extending from substrate features. Additional embodiments relate to methods of producing self-aligned vias.

BACKGROUND

Self-aligned metal oxide pillars can be formed through the oxidation of gap-filled metal films. Metal is deposited on the structure of holes or trenches and then oxidized to form metal oxides. The volumetric expansion during oxidation pushes a pillar out of the holes or trenches. The pillars are selectively grown from the bottom-up from only metal.

Tungsten oxide has been used in forming self-aligned pillars, provided its high thermal expansion and high Young's modulus or stiffness. Tungsten oxide can be formed from tungsten metal via oxidation using oxygen at a high temperature.

However, there are some challenges of using this process because of the rate and amount of volume expansion of a metal to form metal oxide columns. First, rapid changes in stress sometimes lead to degradation of the inherent structure. This can lead to bending or leaning of columns. Second, rapid change in the volume sometimes leads to non-uniform growth. Third, residual, un-oxidized, metal often remains at the bottom of the trench.

There is a need in the art for alternative methods to create self-aligned structures. More specifically, there is a need in the art for alternative methods to create self-aligned columns and structures which afford stiffer, stronger columns.

SUMMARY

One or more embodiments of the disclosure are directed to a substrate processing method comprising providing a substrate with a substrate surface with at least one feature formed therein. The at least one feature extends a distance into the substrate from the substrate surface and has a sidewall and bottom. A metal film is formed in the at least one feature. The metal film is exposed to a chalcogen precursor to form a metal chalcogenide pillar which extends from the at least one feature. The chalcogen precursor comprises substantially no oxygen.

Additional embodiments of the disclosure are directed to a substrate processing method comprising providing a substrate with a substrate surface with at least one feature formed therein. The at least one feature extends a distance into the substrate from the substrate surface and has a sidewall and bottom. A metal film is formed in the at least one feature. The metal film is expanded to form a pillar which extends from the at least one feature. The pillar comprises substantially no oxygen. The pillar is exposed to a chalcogen precursor to form a metal chalcogenide pillar which extends from the at least one feature. The chalcogen precursor comprises substantially no oxygen.

Further embodiments of the disclosure are directed to a substrate processing method comprising providing a substrate with a substrate surface with at least one feature formed therein. The at least one feature extends a distance into the substrate from the substrate surface and has a sidewall and bottom. The substrate is exposed to a metal chalcogenide precursor to form a metal chalcogenide pillar which extends from the at least one feature. The metal chalcogenide precursor comprises substantially no oxygen.

BRIEF DESCRIPTION OF THE DRAWINGS

So that the manner in which the above recited features of the present disclosure can be understood in detail, a more particular description of the disclosure, briefly summarized herein, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
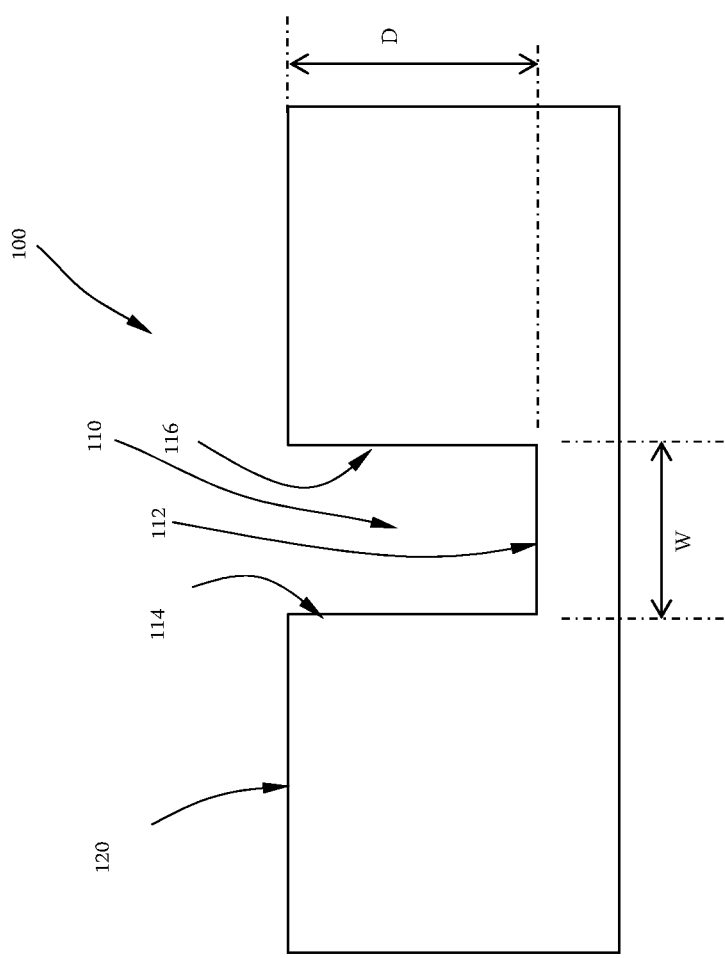
FIG. 1 shows a cross-sectional view of a substrate feature in accordance with one or more embodiments of the disclosure.

In the following description, numerous details, such as materials, chemistries, dimensions of the elements, etc., are set forth in order to provide a thorough understanding of one or more of the embodiments of the present disclosure. One of ordinary skill in the art will understand that the one or more embodiments of the disclosure may be practiced without these details. In other instances, semiconductor fabrication processes, techniques, materials, equipment, etc., have not been described in detail to avoid unnecessarily the obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

Reference throughout this disclosure to "one embodiment", "another embodiment", or "an embodiment" means that a particular feature, structure, or characteristic described in connection with the embodiment is included in at least one embodiment of the present disclosure. Thus, the appearance of phrases like "in one embodiment" or "in an embodiment" in various places throughout the specification are not necessarily all referring to the same embodiment of the disclosure. Furthermore, the particular features, structures, or characteristics may be combined in any suitable manner in one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

The inventors have found that instead of using tungsten oxide pillars to form self-aligned via, other tungsten chalcogenides (e.g., tungsten sulfide or tungsten selenide) can be used. The inventors have also found that the metal can be changed to use other metals (e.g., molybdenum) instead. Accordingly, molybdenum sulfide and molybdenum selenide can also be used to form self-aligned pillars. Without being bound by theory, these materials are known to (i) form nano-rods, (ii) have high expansion factors relative to their metals, and (iii) can form stiff, straight structures.

One or more embodiments of the disclosure are directed to methods for forming self-aligned structures comprising metal chalcogenides. Some embodiments of the disclosure advantageously provide methods of forming metal chalcogenide structures that are stiffer, stronger, lean less and demonstrate more uniform growth than conventional metal oxide pillars. Some embodiments of the disclosure advantageously provide methods of removing a self-aligned structure to produce a self-aligned via.

In general, chalcogens include elements in Group 16 of the periodic table, including but not limited to, oxygen, sulfur, and selenium. As used throughout this disclosure "chalcogens" or "chalcogenides" refers to chalcogens other than oxygen.

FIG. 1 shows a partial cross-sectional view of a substrate 100 with a feature 110. As used in this regard, the term "feature" means any intentional surface irregularity. Suitable examples of features include, but are not limited to trenches, which have a top, two sidewalls and a bottom, valleys which have a top and two sidewalls without a separate bottom, and vias which have sidewalls extending down from a surface with an open bottom or bottom formed by a different material than the sidewalls.

The Figures show substrates having a single feature for illustrative purposes; however, those skilled in the art will understand that there can be more than one feature. The shape of the feature 110 can be any suitable shape including, but not limited to, trenches and cylindrical vias.

The substrate 100 has a top surface 120. The at least one feature 110 forms an opening in the top surface 120. The feature 110 extends from the top surface 120 a depth D to a bottom surface 112. The feature 110 has a first sidewall 114 and a second sidewall 116 that define a width W of the feature 110. The open area formed by the sidewalls and bottom is also referred to as a gap.

In specific embodiments, the feature 110 is a trench. Features can have any suitable aspect ratio (ratio of the depth D of the feature to the width W of the feature). In some embodiments, the aspect ratio is greater than or equal to about 5:1, 10:1, 15:1, 20:1, 25:1, 30:1, 35:1 or 40:1.

Figure 2:
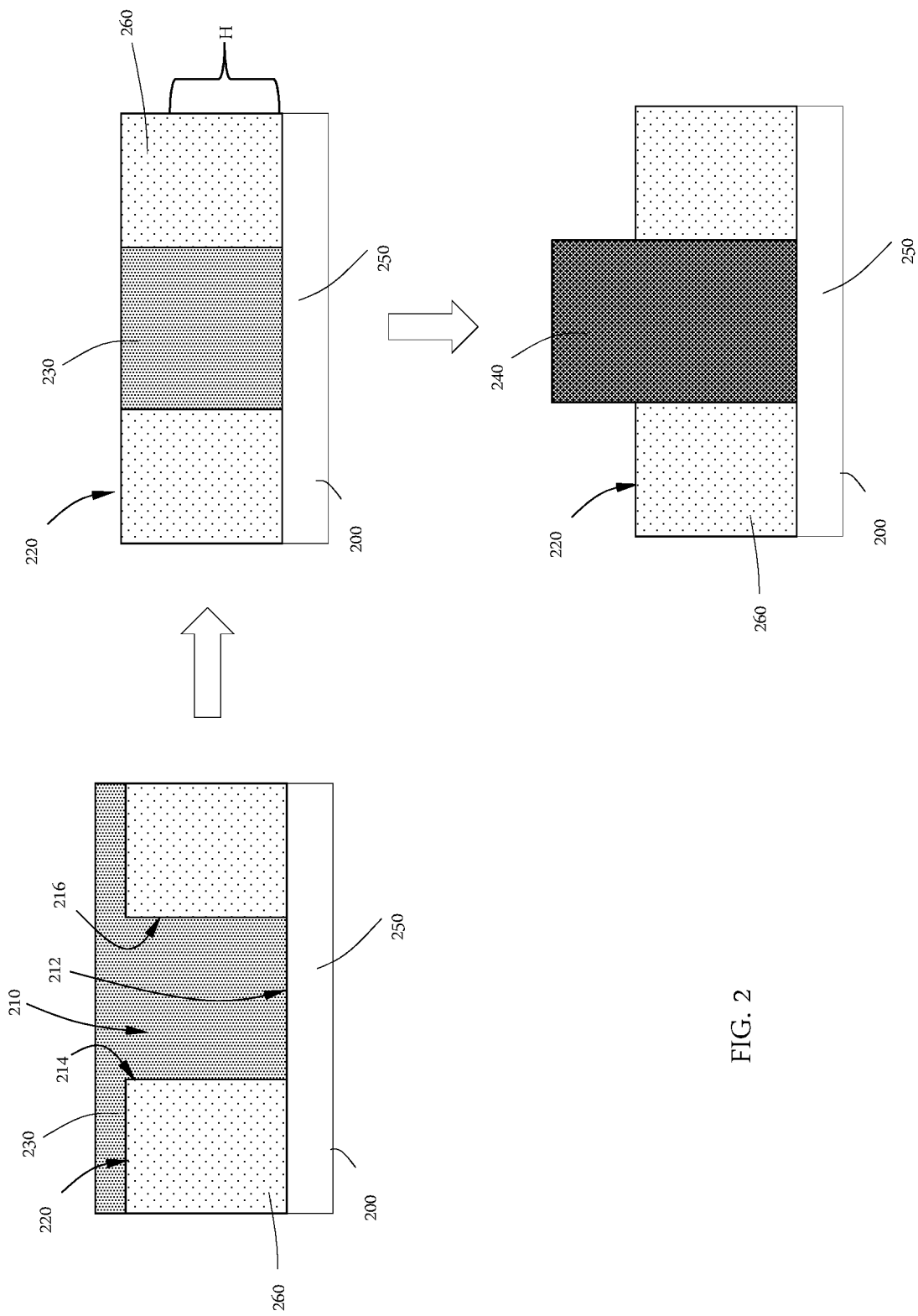
FIG. 2 shows a cross-sectional schematic of a self-aligned structure formation process in accordance with one or more embodiments of the disclosure.

With reference to FIG. 2, a substrate 200 is provided for processing. The substrate 200 is similar to the substrate 100 shown in FIG. 1. As used in this regard, the term "provided" means that the substrate is placed into a position or environment for further processing. In some embodiments, the substrate 200, as illustrated in FIG. 2, has a first surface material 250 and a second surface material 260. The first surface material 250 and the second surface material 260 may be the same or different surface materials on the substrate 200. In some embodiments, a feature 210 is formed with the bottom surface 212 comprised of the first surface 250 and the sidewalls 214, 216 and the top surface 220 comprised of the second surface material 260.

In some embodiments, a film 230 is formed on the top surface 220 and the sidewalls 214, 216 and bottom surface 212 of the feature 210. The film 230 can be any suitable film formed by any suitable process including, but not limited to, chemical vapor deposition, plasma-enhanced chemical vapor deposition, atomic layer deposition, plasma-enhanced atomic layer deposition, physical vapor deposition and/or sputtering.

The film 230 can be any suitable metal containing material. In some embodiments, the film 230 is a metal-containing film. For the purposes of this disclosure and the appended claims, a metal-containing film is any film containing a metal species and may include a metal film or a derivative thereof. A metal-containing film may be comprised of only metal atoms. In some embodiments, the film 230 is a metal or metal alloy film.

A metal-containing film may be comprised of metal atoms and other atoms (e.g. oxygen, nitrogen, carbon, boron). Suitable metal-containing films include derivatives of a metal film. Suitable derivatives of the metal film include, but are not limited to, nitride, boride, carbide, oxynitride, oxyboride, oxycarbide, carbonitride, borocarbide, boronitride, borocarbonitride, borooxycarbonitride, oxycarbonitride, borooxycarbide and borooxynitride.

Those skilled in the art will understand that a metal containing film may have a non-stoichiometric amount of atoms. For example, a film designated as WN may have different amounts of tungsten and nitrogen. The WN film may be, for example, 90 atomic % tungsten. The use of WN to describe a tungsten nitride film means that the film comprises tungsten and nitrogen atoms and should not be taken as limiting the film to a specific atomic composition. In some embodiments, the film consists essentially of the designated atoms. For example, a film consisting essentially of WN means that the composition of the film is greater than or equal to about 95%, 98%, 99% or 99.5% tungsten and nitrogen atoms.

In some embodiments, the film 230 comprises one or more of Co, Mo, W, Ta, Ti, Ru, Rh, Cu, Fe, Mn, V, Nb, Hf, Zr, Y, Al, Sn, Cr, Os, U or La. In some embodiments, the film 230 consists essentially of Co, Mo, W, Ta, Ti, Ru, Rh, Cu, Fe, Mn, V, Nb, Hf, Zr, Y, Al, Sn, Cr, Os, U or La. In some embodiments, the film 230 comprises one or more of tungsten or molybdenum. In some embodiments, the film consists essentially of tungsten. In some embodiments, the film consists essentially of molybdenum. As used in this regard, the term "consists essentially of" means that the stated material is greater than or equal to 98%, 99, or 99.5% of the stated element on an atomic basis.

Suitable metals for use in metal-containing films include, but are not limited to metals having a Pilling-Bedworth ratio greater than 2, greater than 2.25, or greater than 2.5. Pilling-Bedworth ratio refers to a ratio of a volume of the elementary cell of the metal chalcogenide to the volume of the elementary cell of the corresponding metal-containing film from which the metal chalcogenide is formed. The Pilling-Bedworth ratio is defined as the $V_{chalc}/V_{metal}$, where V is volume. For determining the Pilling-Bedworth ratio of a metal chalcogenide, $V_{chalc}$ equals the molecular mass of the of the metal chalcogenide multiplied by the density of the metal chalcogenide, and $V_{metal}$ equals the number of atoms of metal per one molecule of the metal chalcogenide multiplied by the atomic mass of the metal multiplied by the density of the metal chalcogenide. In some embodiments, the metal has a Pilling-Bedworth ratio of greater than 1.5, greater than 1.75, greater than 2.0, greater than 2.25, or greater than 2.5.

In some embodiments, the film 230 may be removed from the top surface 220 such that the film 230 is contained entirely within the feature 210. The film 230 can be removed by any suitable etch process. In some embodiments, the film 230 is removed by a chemical-mechanical planarization (CMP) process.

In some embodiments, substantially all of the film 230 is formed within the feature 210. As used in this regard, the term "substantially all" means that greater than or equal to about 95%, 98% or 99% of the film is formed within the feature 210 on a weight basis.

In some embodiments, the film 230 is selectively deposited within the feature 210 and is not deposited on the top surface 220 of the substrate. In these embodiments, the substrate 200 would be processed such that it would flow from FIG. 1 to the second illustration of FIG. 2 without appearing like the first illustration of FIG. 2. Those skilled in the art will recognize that the compositions of the first surface material 250 and the second surface material 260 may be selected to facilitate selective deposition of the film 230 on one surface relative to the other.

In some embodiments, the method includes selectively depositing a film 230 within the trench to a height H which is less than or equal to the depth D of the feature 210. In one embodiment, the film 230 fills at least 10% of the volume of the trench. In other embodiments, the film 230 fills at least 15%, 20%, 25%, 30%, 35%, 40%, 45%, 50%, 55%, 60%, 65%, 70%, 75%, 80%, 85%, 90%, 95% or 100% of the volume of the feature 210. In some embodiments, the film 230 deposited in the feature 210 has a height H that is less than or equal to about 98%, 95%, 90%, 80%, 70%, 60% or 50% of the depth D of the feature 210.

The film 230 is exposed to a chalcogen precursor to expand the material volume of the film 230 and provide a self-aligned structure 240 comprising a metal chalcogenide. The self-aligned structure may also be referred to as a metal chalcogenide pillar. The chalcogen precursor may be any suitable material comprising a chalcogen which produces a film comprising metal and chalcogen. In some embodiments, the chalcogen precursor comprises substantially no oxygen. As used in this regard, "comprises substantially no oxygen" means that the chalcogen precursor comprises less than 1%, 0.5% or 0.1% oxygen atoms on an atomic basis. In some embodiments, the chalcogen precursor comprises one or more of $H_2S$, alkyl sulfides, alkyl disulfides, $S_8$ powder and Se powder. In some embodiments, $H_2S$ is produced in-situ by the reaction of $Na_2S$ and dilute HCl. In some embodiments, the exposure and subsequent expansion is performed by a process comprising a thermal, plasma enhanced, remote plasma, microwave and/or radio-frequency (e.g., ICP, CCP) reaction.

The self-aligned structure 240 extends beyond the top surface 220 of the substrate. In some embodiments, the self-aligned structure 240 comprises a metal chalcogenide. In this regard, a metal chalcogenide comprises metal atoms and chalcogen atoms. In some embodiments, the metal chalcogenides of the self-aligned structure 240 comprise one or more of sulfur, selenium, or tellurium. In some embodiments, the metal chalcogenides of the self-aligned structure 240 comprise substantially no oxygen. In some embodiments, the metal chalcogenides of the self-aligned structure 240 may also comprise other atoms.

The volume of the self-aligned structure 240 is greater than the volume of the film 230. In some embodiments, the volume of the self-aligned structure 240 is greater than 1.25, greater than 1.5, greater than 1.6, greater than 1.7, greater than 1.75, greater than 1.8, greater than 1.9, greater than 2.0, or greater than 2.5 times the volume of the film. In some embodiments, the volume of the self-aligned structure is less than 3.0, less than 2.5, less than 2.0, less than 1.9, less than 1.8, less than 1.75, less than 1.7, less than 1.6, or less than 1.5 times the volume of the film. In some embodiments, the volume of the self-aligned structure is in the range of greater than 1 to less than 2 times the volume of the film within the feature 210.

When a plurality of features is filled with the film 230, a plurality of self-aligned structures 240 can be formed to provide self-aligned structures. In some embodiments, these self-aligned structures can act as a pattern without using a mask.

As shown in FIG. 2, during expansion, the fidelity of the feature shape is maintained on the top of the feature so that the film 230 grows straight up from the feature 210. As used in this regard, "straight up" means that the sides of the self-aligned structure 240 are substantially coplanar with the sidewall 214, 216 of the feature 210. A surface is coplanar with the sidewall 214 where the angle formed at the junction of the sidewall 214 and the surface is ±10°. In this regard, an expanded film which extends "straight up" from the feature may be described as orthogonal to the top surface of the substrate if the sidewalls are perpendicular to the top surface.

Figure 3:
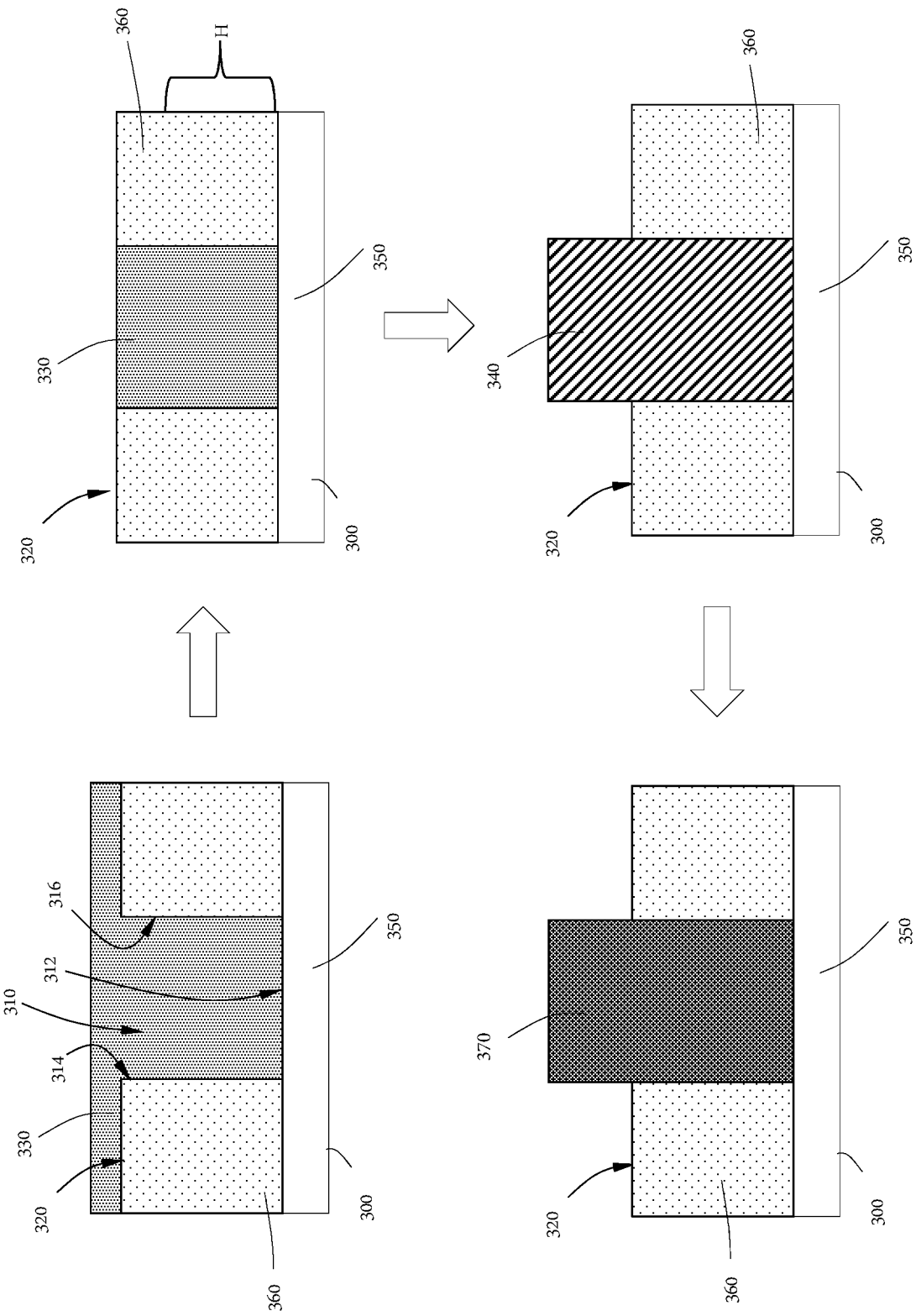
FIG. 3 shows a cross-sectional schematic of a self-aligned structure formation process in accordance with one or more embodiments of the disclosure.

With reference to FIG. 3, a substrate 300 is provided for processing. The substrate 300 is similar to substrates 100 and 200 shown in FIGS. 1 and 2 respectively. Similar to the method described above and illustrated in FIG. 2, in some embodiments, the substrate 300, as illustrated in FIG. 3, has a first surface material 350 and a second surface material 360. The first surface material 350 and the second surface material 360 may be the same or different surface materials on the substrate 300. In some embodiments, a feature 310 is formed with the bottom surface 312 comprised of the first surface 350 and the sidewalls 314, 316 and the top surface 320 comprised of the second surface material 360.

In some embodiments, a film 330 is formed on the top surface 320 and the sidewalls 314, 316 and bottom surface 312 of the feature 310. The film 330 can be any suitable film formed by any suitable process including, but not limited to, chemical vapor deposition, plasma-enhanced chemical vapor deposition, atomic layer deposition, plasma-enhanced atomic layer deposition, physical vapor deposition and/or sputtering. The film 330 is analogous to the film 230 described above.

In some embodiments, the film 330 may be removed from the top surface 320 such that the film 330 is contained entirely within the feature 310. The film 330 can be removed by any suitable etch process. In some embodiments, the film 330 is removed by a chemical-mechanical planarization (CMP) process.

In some embodiments, substantially all of the film 330 is formed within the feature 310. In some embodiments, the film 330 is selectively deposited within the feature 310 and is not deposited on the top surface 320 of the substrate. In these embodiments, the substrate 300 would be processed such that it would flow from FIG. 1 to the second illustration of FIG. 3 without appearing like the first illustration of FIG. 3. Those skilled in the art will recognize that the compositions of the first surface material 350 and the second surface material 360 may be selected to facilitate selective deposition of the film 330 on one surface relative to the other.

In some embodiments, the method includes selectively depositing a film 330 within the trench to a height H which is less than or equal to the depth D of the feature 310. In one embodiment, the film 330 fills at least 10% of the volume of the trench. In other embodiments, the film 230 fills at least 15%, 20%, 25%, 30%, 35%, 40%, 45%, 50%, 55%, 60%, 65%, 70%, 75%, 80%, 85%, 90%, 95% or 100% of the volume of the feature 310. In some embodiments, the film 330 deposited in the feature 310 has a height H that is less than or equal to about 98%, 95%, 90%, 80%, 70%, 60% or 50% of the depth D of the feature 310.

The film 330 is exposed to a reactant to expand the material volume of the film 330 and provide a pillar 340. The reactant may be any suitable material which produces a pillar comprising the metal of the film 330. In some embodiments, the reactant comprises nitrogen and the expansion process is a nitridation process. In some embodiments, the reactant comprises silicon and the expansion process is a silicidation process.

In some embodiments, the reactant comprises substantially no oxygen. In some embodiments, the pillar comprises substantially no oxygen. In some embodiments, the reactant comprises one or more of $N_2$, $NH_3$, $N_2H_4$, or plasmas thereof. In some embodiments, the reactant comprises one or more of silane, disilane, trisilane, tetrasilane, pentasilane, hexasilane, trimethyl silane, compounds with trimethylsilyl substituents, dichlorosilane, trichlorosilane, trisilylamine or plasmas thereof.

In some embodiments, the exposure and subsequent expansion is performed by a process comprising a thermal, plasma enhanced, remote plasma, microwave and/or radiofrequency (e.g., ICP, CCP) reaction.

In some embodiments, expanding the film 330 may utilize a plasma source. Plasma may be generated remotely or within the processing chamber. Plasma may be inductively coupled plasma (ICP) or conductively coupled plasma (CCP). Treatment can occur at any suitable power depending on, for example, the composition of the film, the reactant, a predetermined rate of expansion or a predetermined amount of volumetric expansion. In some embodiments, the film expansion utilizes a plasma power in the range of about 2 kW to about 10 kW. In some embodiments, expansion utilizes a plasma power greater than or equal to about 2 kW, 5 kw, or 8 kW. In some embodiments, expansion utilizes a plasma power less than or equal to about 10 kW, 8 kW, or 5 kW. In some embodiments, expansion utilizes a plasma power of about 10 kW.

In some embodiments, expanding the film 330 may utilize a microwave or radio frequency. Treatment can occur at any suitable frequency depending on, for example, the composition of the film, the reactant, a predetermined rate of expansion or a predetermined amount of volumetric expansion. In some embodiments, the film expansion utilizes a frequency in the range of about 2 MHz to about 100 MHz. In some embodiments, expansion utilizes a frequency greater than or equal to about 2 MHz, 5 MHz, 10 MHz, 13.56 MHz, 25 MHz, 30 MHz, 40 MHz, 50 MHz, 60 MHz, 75 MHz, or 100 MHz. In some embodiments, expansion utilizes a frequency less than or equal to about 100 MHz, 90 MHz, 75 MHz, 50 MHz, 40 MHz, 30 MHz, 25 MHz, 10 MHz, or 5 MHz. In some embodiments, expansion utilizes a frequency of about 13.56 MHz.

In some embodiments, the rate of expansion of the film to form the pillar is controlled. In some embodiments, the quantity of expansion is controlled. In some embodiments, the rate or quantity of expansion is controlled by co-flowing hydrogen gas with the reactant. Without being bound by theory, it is believed that exposing the substrate to hydrogen gas slows the reaction by promoting a competing reverse reaction and/or shifting the equilibrium of the reaction by introducing a reaction product.

The hydrogen gas may be supplied to the processing chamber at any suitable flow rate depending on, for example, the composition of the film, the reactant, a predetermined rate of expansion or a predetermined amount of volumetric expansion. In some embodiments, the hydrogen gas is provided at a flow rate in the range of greater than 0 sccm to about 5000 sccm. In some embodiments, the hydrogen gas is provided at a flow rate of about 1000 sccm.

In some embodiments, the rate or quantity of expansion is controlled by exposing the self-aligned structure to a hydrogen plasma source. Without being bound by theory, it is believed that the hydrogen plasma removes reactant atoms (e.g., N or Si) from the pillar and returns the volume of the pillar towards the volume of the film before expansion.

The pillar 340 extends beyond the top surface 320 of the substrate. The volume of the pillar 340 is greater than the volume of the film 330. In some embodiments, the volume of the pillar 340 is greater than 1.25, greater than 1.5, greater than 1.6, greater than 1.7, greater than 1.75, greater than 1.8, greater than 1.9, greater than 2.0, or greater than 2.5 times the volume of the film. In some embodiments, the volume of the self-aligned structure is less than 3.0, less than 2.5, less than 2.0, less than 1.9, less than 1.8, less than 1.75, less than 1.7, less than 1.6, or less than 1.5 times the volume of the film. In some embodiments, the volume of the self-aligned structure is in the range of greater than 1 to less than 2 times the volume of the film within the feature 310.

As shown in FIG. 3, during expansion, the fidelity of the feature shape is maintained on the top of the feature so that the film 330 grows straight up from the feature 310. As used in this regard, "straight up" means that the sides of the pillar 340 are substantially coplanar with the sidewall 314, 316 of the feature 310. A surface is coplanar with the sidewall 314 where the angle formed at the junction of the sidewall 314 and the surface is ±10°. In this regard, a pillar which extends "straight up" from the feature may be described as orthogonal to the top surface of the substrate if the sidewalls are perpendicular to the top surface.

The pillar 340 is exposed to a chalcogen precursor to form a self-aligned structure 370. The self-aligned structure 370 may also be referred to as a metal chalcogenide pillar. The chalcogen precursor may be any suitable material comprising a chalcogen which converts the pillar to a metal chalcogen pillar. In some embodiments, the chalcogen precursor comprises substantially no oxygen. In some embodiments, the chalcogen precursor comprises one or more of $H_2S$, alkyl sulfides, alkyl disulfides, $S_8$ powder and Se powder. In some embodiments, $H_2S$ is produced in-situ by the reaction of $Na_2S$ and dilute HCl. In some embodiments, the exposure and subsequent conversion is performed by a process comprising a thermal, plasma enhanced, remote plasma, microwave and/or radio-frequency (e.g., ICP, CCP) reaction.

In some embodiments, the self-aligned structure 370 comprises a metal chalcogenide. In this regard, a metal chalcogenide comprises metal atoms and chalcogen atoms. In some embodiments, the metal chalcogenides of the self-aligned structure 370 comprise one or more of sulfur, selenium, or tellurium. In some embodiments, the metal chalcogenides of the self-aligned structure 370 comprise substantially no oxygen. In some embodiments, the metal chalcogenides of the self-aligned structure 370 may comprise atoms other than the metal of the film 330 and the chalcogen of the chalcogen precursor.

Figure 4:
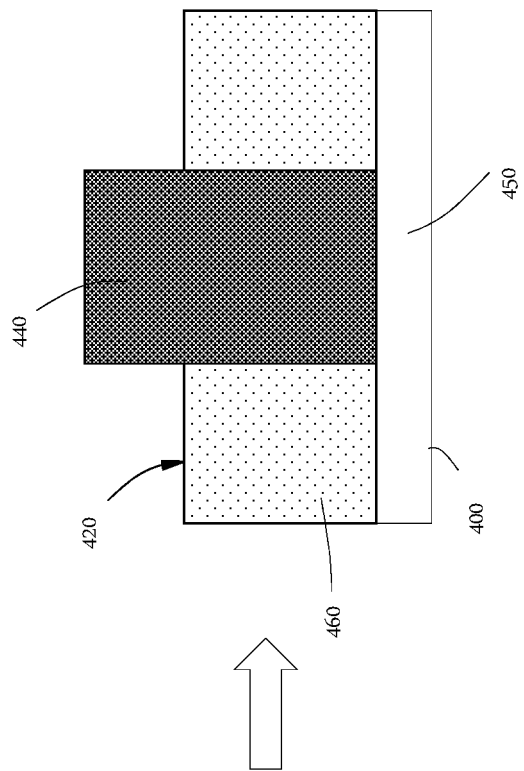
FIG. 4 shows a cross-sectional schematic of a self-aligned structure formation process in accordance with one or more embodiments of the disclosure.
Figure 4:
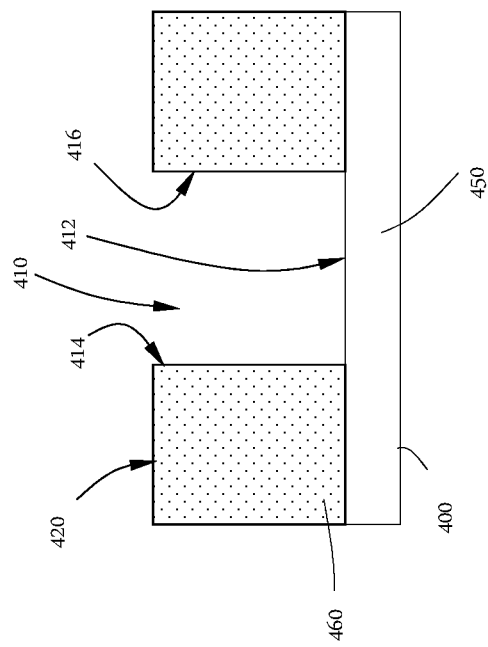
Figure 5:
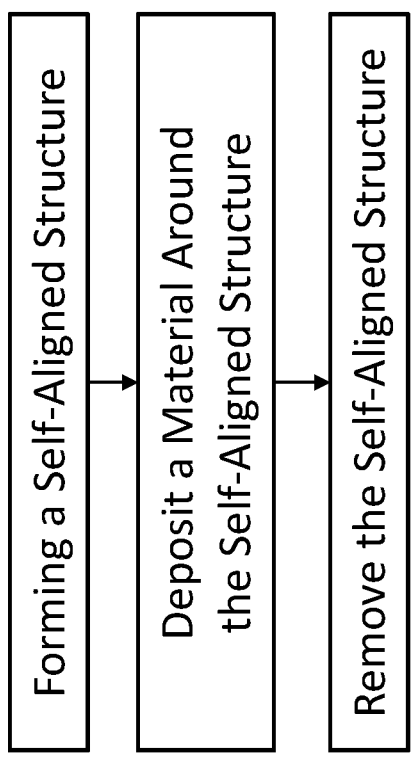
FIG. 5 shows an exemplary processing method for forming a self-aligned via in accordance with one or more embodiments of the disclosure.

With reference to FIG. 4, a substrate 400 is provided for processing. The substrate 400 is similar to substrates 100, 200 and 300 shown in FIGS. 1, 2 and 3 respectively. Similar to the methods described above and illustrated in FIGS. 2 and 3, in some embodiments, the substrate 400, as illustrated in FIG. 4, has a first surface material 450 and a second surface material 460. The first surface material 450 and the second surface material 460 may be the same or different surface materials on the substrate 400. In some embodiments, a feature 410 is formed with the bottom surface 412 comprised of the first surface 450 and the sidewalls 414, 416 and the top surface 420 comprised of the second surface material 460.

The substrate 400 is exposed to a metal chalcogenide precursor to form a self-aligned structure 440. The self-aligned structure may also be referred to as a metal chalcogenide pillar. The metal chalcogenide pillar comprises a metal chalcogenide. The metal chalcogen precursor may be any suitable compound comprising a metal and a chalcogen which produces a film comprising metal and chalcogen. The metal may be any suitable metal. In some embodiments, the metal chalcogenide pillar comprises one or more of tungsten and molybdenum. In some embodiments, the metal chalcogenide pillar comprises one or more of sulfur, selenium, or tellurium. In some embodiments, the metal chalcogen precursor comprises substantially no oxygen.

In some embodiments, the metal chalcogenide precursor comprises a cation and a metal complex anion. In some embodiments, the cation comprises an ammonium-based cation, $NR_4^+$ where each R is independently H or a C1-C4 alkyl group. As used in this manner, the letter "C" followed by a numeral (e.g., "C4") means that the substituent comprises the specified number of carbon atoms (e.g., C4 comprises four carbon atoms). The alkyl groups can be straight chain groups (e.g. n-butyl) or branched groups (e.g. t-butyl). In some embodiments, each R is hydrogen ($NH_4^+$). In some embodiments, each R is methyl. In some embodiments, the metal complex anion comprises a chalcogen. In some embodiments, the metal complex anion comprises one or more of a metal sulfide, a metal selenide or a metal telluride.

In some embodiments, the metal chalcogenide precursor is represented by the general formula $(R_4N)_xM_aZ_y$, where each R is independently H or C1-C4 alkyl, M is a metal, Z is a chalcogen and x, y, and a are integers from 1 to 6 such that the metal chalcogenide precursor is electrochemically neutral. In some embodiments, the metal chalcogenide precursor comprises ammonium tetrathiotungstate (($H_4N$)$_2WS_4$). In some embodiments, the metal chalcogenide precursor comprises tetraalkylammonium tetrathiotungstate (($R_4N$)$_2WS_4$), where each R is an independently selected C1-C4 alkyl group.

In some embodiments, the exposure and subsequent formation is performed by a process comprising a thermal, plasma enhanced, remote plasma, microwave and/or radio-frequency (e.g., ICP, CCP) reaction.

In some embodiments, the self-aligned structure 440 is selectively formed within the feature 410 and is not deposited on the top surface 420 of the substrate. Those skilled in the art will recognize that the compositions of the first surface material 450 and the second surface material 460 may be selected to facilitate selective formation of the self-aligned structure 440 on one surface relative to the other.

As shown in FIG. 4, after formation, the fidelity of the feature shape is maintained on the top of the feature so that the self-aligned structure 440 forms straight up from the feature 410. As used in this regard, "straight up" means that the sides of the self-aligned structure 440 are substantially coplanar with the sidewall 414, 416 of the feature 410. A surface is coplanar with the sidewall 414 where the angle formed at the junction of the sidewall 414 and the surface is ±10°. In this regard, a self-aligned structure 440 which extends "straight up" from the feature may be described as orthogonal to the top surface of the substrate if the sidewalls are perpendicular to the top surface.

In some embodiments, after forming a self-aligned structure by any of the above methods, a material is deposited around the self-aligned structure. In some embodiments, the material is a dielectric material. In some embodiments, the material is the same as the first surface material or the second surface material. In some embodiments, the deposited material is an inter-layer dielectric (ILD).

In some embodiments, after depositing the material, the self-aligned structure is removed to form a self-aligned via. In some embodiments, the self-aligned structure is removed by exposing the self-aligned structure to an etchant. In some embodiments, the etchant comprises an alkaline solution. In some embodiments, the alkaline solution comprises one or more of KOH, NaOH, or $NH_4OH$. In some embodiments, the etchant is a metal halide etchant. In some embodiments, the etchant is a metal fluoride etchant. In some embodiments, the etchant comprises $WF_6$. In some embodiments, the etchant is a metal chloride etchant. In some embodiments, the etchant comprises $WCl_6$ or $WCl_6$.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A substrate processing method comprising:
forming a metal film on a substrate with a top surface with at least one feature formed therein, the at least one feature extending a distance into the substrate from the top surface and having a sidewall and bottom, the metal film formed in the at least one feature; and
exposing the metal film to a chalcogen precursor to form a metal chalcogenide pillar, the pillar growing straight up above the at least one feature, having sidewalls above the top surface that are substantially coplanar with the sidewalls of the at least one feature, or having sidewalls above the top surface which are orthogonal to the top surface, the chalcogen precursor comprising substantially no oxygen.

2. The method of claim 1, wherein the metal comprises one or more of tungsten and molybdenum.

3. The method of claim 1, wherein the chalcogen precursor comprises one or more of $H_2S$, alkyl sulfides, alkyl disulfides, $S_8$ powder and Se powder.

4. The method of claim 1, wherein the metal chalcogenide pillar comprises one or more of sulfur, selenium, or tellurium.

5. The method of claim 1, wherein the metal chalcogenide pillar is orthogonal to the top surface.

6. The method of claim 1, wherein a volumetric ratio of the metal chalcogenide pillar to the metal film is greater than or equal to about 2.

7. A method for producing self-aligned vias, the method comprising:
forming a metal chalcogenide pillar according to claim 1;
depositing a dielectric material on the top surface, the dielectric material surrounding the metal chalcogenide pillar; and
removing the metal chalcogenide pillar to leave a via through the dielectric material.

8. A substrate processing method comprising:
forming a metal film on a substrate with a top surface with at least one feature formed therein, the at least one feature extending a distance into the substrate from the top surface and having a sidewall and bottom, the metal film formed in the at least one feature;
exposing the metal film to a reactant to expand the material volume of the metal film and form a pillar comprising substantially no oxygen, the pillar growing straight up above the at least one feature, having sidewalls above the top surface that are substantially coplanar with the sidewalls of the at least one feature, or having sidewalls above the top surface which are orthogonal to the top surface; and
exposing the pillar to a chalcogen precursor to form a metal chalcogenide pillar, the chalcogen precursor comprising substantially no oxygen.

9. The method of claim 8, wherein the metal comprises one or more of tungsten and molybdenum.

10. The method of claim 8, wherein the pillar comprises one or more of nitrogen, carbon or silicon.

11. The method of claim 8, wherein the chalcogen precursor comprises one or more of $H_2S$, dialkyl disulfides, $S_8$ powder and Se powder.

12. The method of claim 8, wherein the metal chalcogenide pillar comprises one or more of sulfur, selenium, or tellurium.

13. The method of claim 8, wherein the metal chalcogenide pillar is orthogonal to the substrate surface.

14. A method for producing self-aligned vias, the method comprising:
forming a metal chalcogenide pillar according to claim 8;
depositing a dielectric material on the substrate surface, the dielectric material surrounding the metal chalcogenide pillar; and
removing the metal chalcogenide pillar to leave a via through the dielectric material.

15. A substrate processing method comprising:
exposing a substrate to a metal chalcogenide precursor to form a metal chalcogenide pillar, the substrate having a top surface with at least one feature formed therein, the at least one feature extending a distance into the substrate from the top surface and having a sidewall and bottom, the metal chalcogenide pillar growing straight up above the at least one feature, having sidewalls above the top surface that are substantially coplanar with the sidewalls of the at least one feature, or having sidewalls above the top surface which are orthogonal to the top surface, and the metal chalcogenide pillar comprising substantially no oxygen.

16. The method of claim 15, wherein the metal chalcogenide pillar comprises one or more of tungsten and molybdenum.

17. The method of claim 15, wherein the metal chalcogenide pillar comprises one or more of sulfur, selenium, or tellurium.

18. The method of claim 15, wherein the metal chalcogenide precursor is represented by the general formula $(R_4N)_xM_aZ_y$, where each R is independently H or C1-C4 alkyl, M is a metal, Z is a chalcogen and x, y, and a are integers from 1 to 6 such that the metal chalcogenide precursor is electrochemically neutral.

19. The method of claim 18, wherein the metal chalcogenide precursor comprises bis-tetraalkylammonium tetrathiotungstate $((R_4N)_2WS_4)$, where R is a C1-4 alkyl group.

20. A method for producing self-aligned vias, the method comprising:
forming a metal chalcogenide pillar according to claim 15;
depositing a first material comprising a dielectric on the top surface, the first material surrounding the metal chalcogenide pillar; and
removing the metal chalcogenide pillar to leave a via through the first material.

* * * * *